(12) United States Patent
Jung (10) Patent No.: US 8,363,489 B2
(45) Date of Patent: Jan. 29, 2013

(54) SEMICONDUCTOR DEVICE HAVING BIT LINE EQUALIZATION USING LOW VOLTAGE AND A METHOD THEREOF

(75) Inventor: Tae-Hyung Jung, San Jose, CA (US)

(73) Assignee: Hynix Semiconductor Inc., Gyeonggi-do (KR)

( * ) Notice: Subject to any disclaimer, the term of this patent is extended or adjusted under 35 U.S.C. 154(b) by 290 days.

(21) Appl. No.: 12/649,379

(22) Filed: Dec. 30, 2009

(65) Prior Publication Data

US 2011/0158019 A1 Jun. 30, 2011

(51) Int. Cl.
*G11C 7/00* (2006.01)

(52) U.S. Cl. .............. 365/189.11; 365/203; 365/189.09; 365/230.06

(58) Field of Classification Search .................. 365/203, 365/189.09, 189.11, 230.06, 185.23, 185.25
See application file for complete search history.

(56) References Cited

U.S. PATENT DOCUMENTS

| RE36,932 E | * | 10/2000 | Furutani | 365/226 |
| 6,574,161 B2 | * | 6/2003 | Ooishi | 365/182 |
| 6,667,921 B2 | * | 12/2003 | Park | 365/203 |
| 7,564,728 B2 | * | 7/2009 | Han | 365/203 |
| 2004/0052146 A1 | * | 3/2004 | Sim | 365/230.03 |

FOREIGN PATENT DOCUMENTS

| KR | 1019980012456 | | 4/1998 |
| KR | 1019990088380 | | 12/1999 |
| KR | 10-2005-0101893 | A | 10/2005 |
| KR | 10-2007-0036620 | A | 4/2007 |
| KR | 10-0803364 | B1 | 2/2008 |
| KR | 10-2008-0114415 | A | 12/2008 |

OTHER PUBLICATIONS

Notice of Allowance issued from Korean Intellectual Property Office on Oct. 26, 2011.
Notice of Preliminary Rejection issued from Korean Intellectual Property Office on Aug. 3, 2011.

* cited by examiner

*Primary Examiner* — Kretelia Graham
(74) *Attorney, Agent, or Firm* — IP & T Group LLP (57) ABSTRACT

A semiconductor memory device that can minimize the area of a circuit for generating a BLEQ signal by using one power source voltage terminal floated for the generation of a BLEQ signal. The semiconductor memory device includes a power source supplier configured to supply a power source of a main power source voltage terminal to a sub-power source voltage terminal in response to a mat selection signal for selecting a corresponding memory cell mat among a plurality of memory cell mats, a bit line equalization (BLEQ) signal generator configured to be coupled with the sub-power source voltage terminal and generate a BLEQ signal corresponding to a voltage level of the sub-power source voltage terminal in response to a BLEQ control signal, and a bit line equalizer configured to precharge and equalize a bit line pair in response to the BLEQ signal.

17 Claims, 6 Drawing Sheets

SEMICONDUCTOR DEVICE HAVING BIT LINE EQUALIZATION USING LOW VOLTAGE AND A METHOD THEREOF

BACKGROUND OF THE INVENTION

Exemplary embodiments of the present invention relate to a semiconductor design technology, and more particularly, to a semiconductor memory device performing read and write operations with data transferred through a pair of a bit line and a bit line bar. To be specific, the exemplary embodiments of the present invention relate to a semiconductor memory device which performs a bit line equalization operation by precharging a bit line pair before the data is applied to the bit line pair.

General semiconductor memory devices, including a Double Data Rate Synchronous Dynamic Random Access Memory (DDR SDRAM), include thousands of memory cells for storing data, and store data or output the data according to a command issued from a chipset. In other words, when a chipset requests a write operation, a semiconductor memory device stores data in a memory cell corresponding to an address inputted from the chipset. When the chipset requests a read operation, the semiconductor memory device outputs data from a memory cell corresponding to an address inputted from the chipset. During a write operation, data inputted through an input/output pad is inputted to a memory cell through a data input path, and during a read operation, data is outputted from a memory cell to the exterior through a data output path and an input/output pad.

Meanwhile, a semiconductor memory device includes thousands of memory cells and a set of the memory cells is generally referred to as a memory bank. The number of memory banks inside a semiconductor memory device may be different according to how it is designed. The number of memory banks is on the rise to increase the capacity of a semiconductor memory device.

Figure 1:
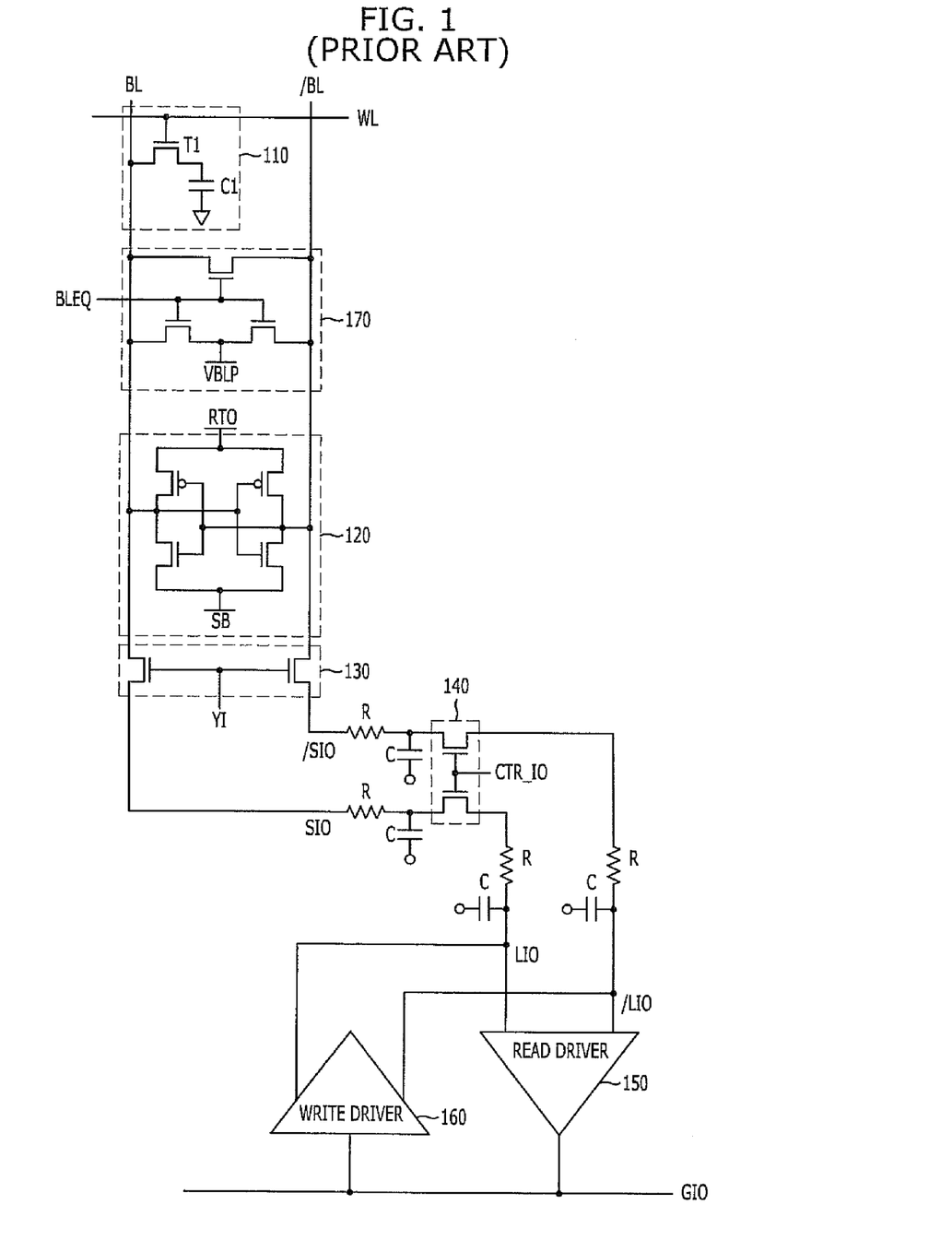
FIG. 1 is a circuit diagram illustrating a conventional read operation and write operation of a semiconductor memory device.

FIG. 1 illustrates a read operation and a write operation of a conventional semiconductor memory device. Although the semiconductor memory device is designed to have thousands of memory cells inside, the drawing shows one memory cell for the sake of the description herein. The memory cell is labeled with reference numeral '110.'

Referring to FIG. 1, a simple read operation performed in a semiconductor memory device will be described hereafter. First, when a word line WL is selected by decoding a row address inputted based upon an active command, a cell transistor T1 of the memory cell 110 is turned on, and data stored in a cell capacitor C1 is charge-shared by a precharged bit line pair BL and /BL. The charge-sharing operation creates a slight potential difference between a bit line BL and a bit line bar /BL. Herein, the cell capacitor C1 is coupled between the cell transistor T1 and a cell plate voltage terminal.

Subsequently, a bit line sense amplifier 120 senses the slight potential difference between the bit line BL and the bit line bar /BL, and amplifies the slight potential difference. In other words, when the potential of the bit line BL is higher than the potential of the bit line bar /BL, the bit line BL is pulled up to a pull-up power source voltage RT0, and the bit line bar /BL is pulled down to a pull-down power source voltage SB. Conversely, when the potential of the bit line BL is lower than the potential of the bit line bar /BL, the bit line BL is pulled down to a pull-down power source voltage SB, and the bit line bar /BL is pulled up to a pull-up power source voltage RT0.

Meanwhile, when a column selection signal YI, selected by decoding a column address inputted based upon a column command signal, is activated, a transistor of a column selector 130 is turned on, and thus, the bit line pair BL and /BL and a segment input/output line pair SI0 and /SI0 are coupled. In other words, a data amplified in the bit line BL is transferred to a segment input/output line SI0, and a data amplified in the bit line bar /BL is transferred to a segment input/output line bar /SI0.

Subsequently, a transistor of an input/output switch 140 is turned on in response to an input/output control signal CTR_I0 corresponding to an active command, and the segment input/output line pair SI0 and /SI0 and local input/output line pair LI0 and /LI0 are coupled. In other words, a data transferred to a segment input/output line SI0 is transferred to a local input/output line LI0, and a data transferred to a segment input/output line bar /SI0 is transferred to a local input/output line bar /LI0. Lastly, a read driver 150 drives a global input/output line GI0 based on the data transferred through the local input/output line pair LI0 and /LI0.

In sum, first the data stored in the memory cell 110 is transferred from the bit line pair BL and /BL to the segment input/output line pair SI0 and /SI0 in response to the column selection signal YI. Then, the data transferred to the segment input/output line pair SI0 and /SI0 is transferred to the local input/output line pair LI0 and /LI0 in response to the input/output control signal CTR_I0. Next, the data transferred to the local input/output line pair LI0 and /LI0 is transferred to the global input/output line GI0. Finally, the transferred data is outputted to the exterior through a corresponding input/output pad (not shown).

Meanwhile, a data applied from the exterior during a write operation is transferred in a direction opposite to the read operation. In other words, a data applied through an input/output pad is transferred from the global input/output line GI0 to the local input/output line pair LI0 and /LI0 through a write driver 160, from the local input/output line pair LI0 and /LI0 to the segment input/output line pair SI0 and /SI0, and from the segment input/output line pair SI0 and /SI0 to the bit line pair BL and /BL. Finally, the data transferred through the path is stored in the corresponding memory cell 110.

The bit line pair BL and /BL is precharged to a precharge voltage VBLP, which is predetermined prior to read and write operations. This operation is performed by a bit line equalizer 170. The bit line equalizer 170 precharges the bit line pair BL and /BL to the precharge voltage VBLP in response to a bit line equalization (BLEQ) signal to thereby equalize the bit line pair. When the BLEQ signal is activated, the precharge voltage VBLP is applied to both the bit line BL and the bit line bar /BL.

A BLEQ signal is generally activated to a voltage level of an external power source voltage VDD, and a transistor of the bit line equalizer 170 is turned on in response to the BLEQ signal. However, the voltage level of the external power source voltage VDD, which is used for the BLEQ signal, has recently been on the decline. Accordingly, it takes a significant amount of time for the transistor of the bit line equalizer 170 to precharge the bit line pair BL and /BL. In order to overcome reduce the time needed to precharge the bit line pair BL and /BL, a power source voltage higher than the external power source voltage VDD is used to drive the BLEQ signal. However, the BLEQ signal having a high voltage level applies a stress to the transistor of the bit line equalizer 170 and causes another concern, which is the occurrence of large leakage current. Therefore, a recent trend is to perform an operation described in FIG. 3 by using a BLEQ signal generator of FIG. 2.

Figure 2:
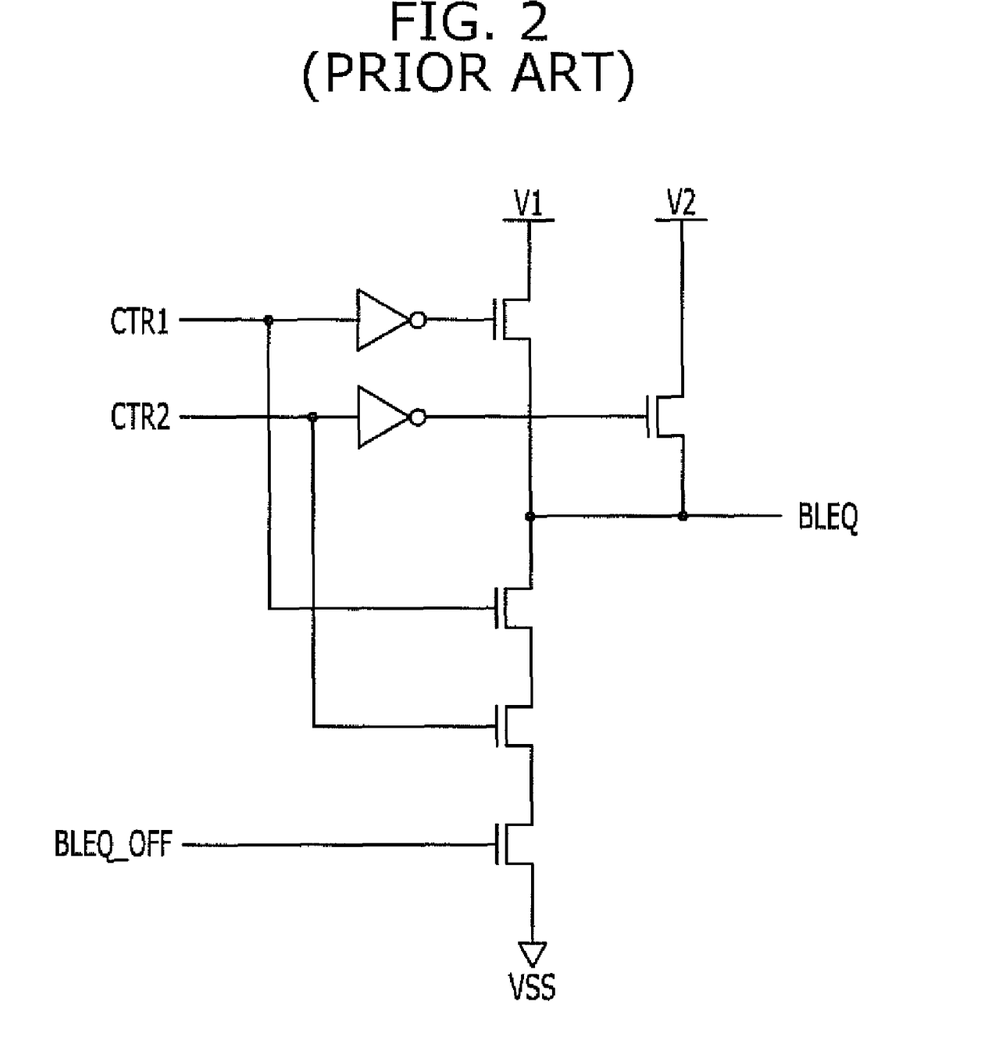
FIG. 2 is a circuit diagram illustrating a circuit for generating a bit line equalization (BLEQ) signal.

FIG. 2 is a circuit diagram illustrating a circuit for generating a BLEQ signal. Referring to FIG. 2, a BLEQ signal generator drives a BLEQ terminal with a first power source voltage V1 and a second power source voltage V2 in response to a first BLEQ control signal CTR1 and a second BLEQ control signal CTR2. Herein, the first and second BLEQ control signals CTR1 and CTR2 are each activated for a predetermined duration within a precharge duration of a bit line pair BL and /BL prior to read and write operations. The first power source voltage V1 has a voltage level higher than the second power source voltage V2.

Figure 3:
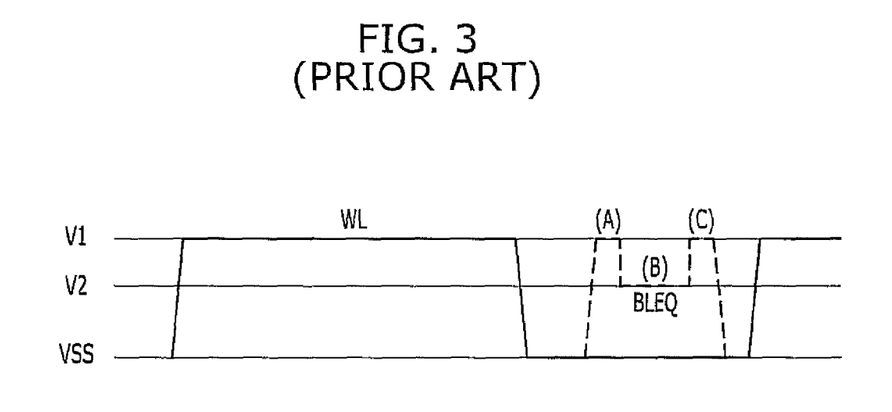
FIG. 3 is a timing diagram describing a circuit operation of a BLEQ signal generator shown in FIG. 2.

FIG. 3 is a timing diagram describing a circuit operation of a BLEQ signal generator shown in FIG. 2. A BLEQ signal is reset to logic low in response to the first and second BLEQ control signals CTR1 and CTR2, while a BLEQ off signal BLEQ_OFF is activated.

Referring to FIG. 3, a word line WL is activated based upon an active command and read and write operations are performed during the duration that the active command is provided. After the word line WL is inactivated, that is, when a precharge operation begins, a BLEQ signal is driven by a first power source voltage V1 as shown by (A) in response to the first BLEQ control signal CTR1. Subsequently, the first BLEQ control signal CTR1 is inactivated and the BLEQ signal is driven by a second power source voltage V2 as shown by (B) in response to the second BLEQ control signal CTR2. Subsequently, before the end of the precharge operation, the BLEQ signal is again driven by the first power source voltage V1 as shown by (C) in response to the first BLEQ control signal CTR1.

Thus, the BLEQ is driven in the method of (A)→(B)→(C) in order to address the above-mentioned concerns. In this method, it is possible to shorten a precharge operation time using a high voltage and to reduce the stress applied to the transistor of the bit line equalizer 170 and the amount of leakage current. In particular, the driving operation of (C) is performed in order to perform a desired equalization operation by stably precharging the bit line pair BL and /BL before the word line WL is re-activated according to the next active operation.

Meanwhile, conventional semiconductor memory devices require a first power source voltage VI corresponding to a high voltage and a second power source voltage V2 corresponding to a low voltage in order to generate a bit line equalization (BLEQ) signal. A power source circuit for generating such power source voltages should be assigned with a relatively large space. Also, a power source line for transmitting a power source should be assigned with a relatively large space as well. Since a power source line applies power noise to adjacent other circuits, the power source line should be disposed carefully. Also, generation of a first BLEQ control signal CTR1 and a second BLEQ control signal CTR2 requires a circuit for generating the first and second BLEQ control signals CTR1 and CTR2 and a timing control circuit for controlling moments when the first and second BLEQ control signals CTR1 and CTR2 are to be activated or inactivated. The additional circuits not only make a semiconductor memory device larger, but also increase the power consumption of the semiconductor memory device.

SUMMARY OF THE INVENTION

An exemplary embodiment of the present invention is directed to a semiconductor memory device using one power source voltage terminal floated for the generation of a bit line equalization (BLEQ) signal.

Another exemplary embodiment of the present invention is directed to a semiconductor memory device capable of controlling the voltage level of a BLEQ signal based on leakage current which is naturally caused.

In accordance with an embodiment of the present invention, a semiconductor memory device includes a power source supplier configured to supply a power source of a main power source voltage terminal to a sub-power source voltage terminal in response to a mat selection signal for selecting a corresponding memory cell mat among a plurality of memory cell mats, a BLEQ signal generator configured to be coupled with the sub-power source voltage terminal and generate a BLEQ signal corresponding to a voltage level of the sub-power source voltage terminal in response to a BLEQ control signal, and a bit line equalizer configured to precharge and equalize a bit line pair in response to the BLEQ signal.

In accordance with another embodiment of the present invention, a semiconductor memory device includes a power source supplier configured to supply a power source of a main power source voltage terminal to a sub-power source voltage terminal in response to a mat selection signal for selecting a corresponding memory cell mat among a plurality of memory cell mats, a BLEQ signal generator configured to have a power source terminal separately coupled with the main power source voltage terminal and the sub-power source voltage terminal, and generate a BLEQ signal corresponding to a voltage level of the sub-power source voltage terminal in response to a BLEQ control signal, and a bit line equalizer configured to precharge and equalize a bit line pair in response to the BLEQ signal.

In accordance with yet another embodiment of the present invention, a method for driving a semiconductor memory device includes selecting a memory cell mat and performing a predetermined operation, floating a sub-power source voltage terminal to thereby decrease a voltage level of the sub-power source voltage terminal, when the memory cell mat is inactivated after the performing of the predetermined operation, and increasing the voltage level of the sub-power source voltage terminal, when the memory cell mat is selected.

The semiconductor memory device according to exemplary embodiments of the present invention can minimize the area of a circuit for generating a BLEQ signal by using one power source voltage terminal floated for the generation of a BLEQ signal. Also, the semiconductor memory device according to exemplary embodiments of the present invention can perform an effective equalization operation of a bit line pair by controlling a voltage level of a BLEQ signal based on leakage current caused in a circuit.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments.

Figure 4:
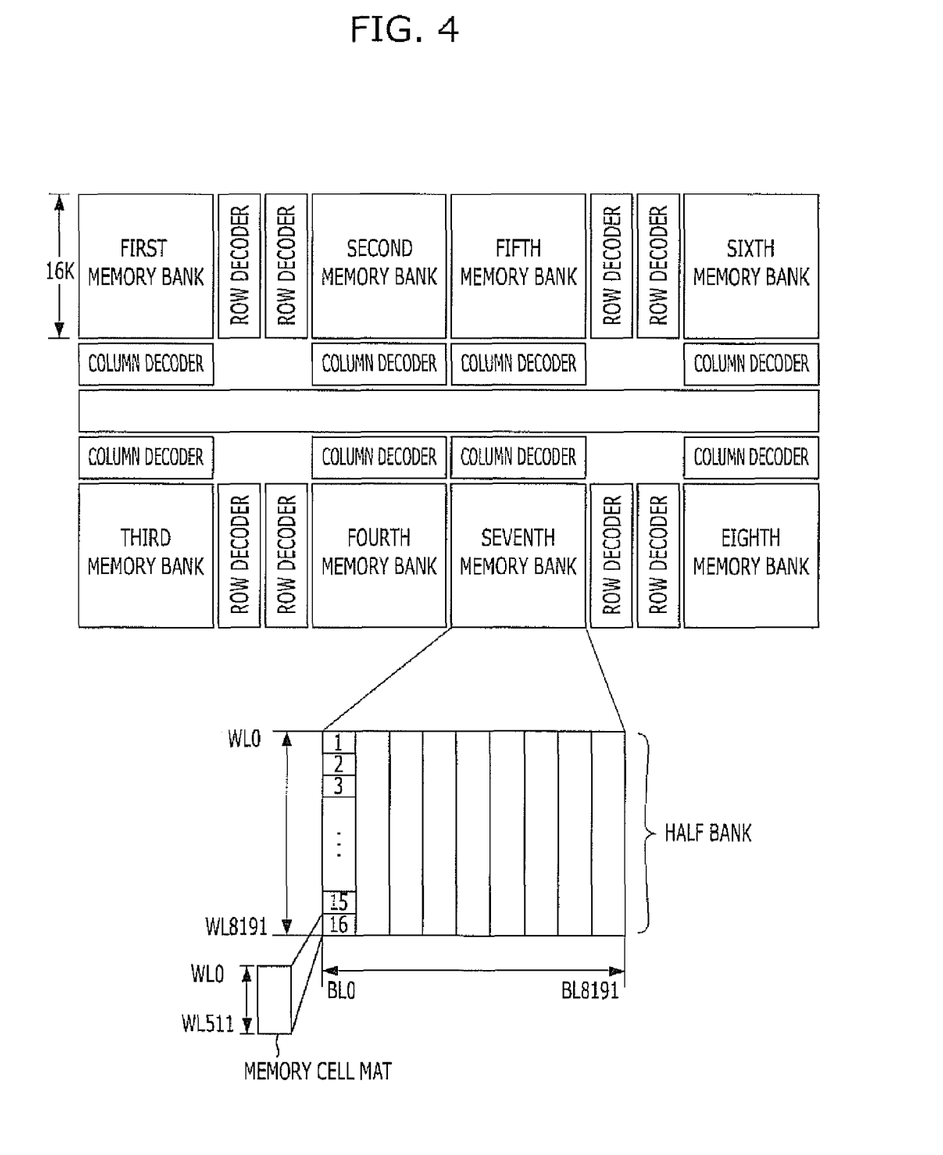
FIG. 4 is a block diagram showing a portion of a semiconductor memory device in accordance with an embodiment of the present invention.

FIG. 4 is a block diagram showing a portion of a semiconductor memory device in accordance with an exemplary embodiment of the present invention. Referring to FIG. 4, the semiconductor memory device includes first to eighth memory banks having corresponding row decoders and column decoders. Each set of a row decoder and a column decoder corresponding to each memory bank, is used for decoding a row address and a column address, respectively.

One memory bank includes 16K word lines. A half bank is a half of one memory bank and a half bank includes 8 word lines WL0 . . . WL8191. In other words, one half bank includes 8192 word lines WL0 . . . WL8191 in correspondence with a row address, and bit lines BL0 . . . BL8191 in correspondence with a column address. Subsequently, the 8192 word lines WL0 . . . WL8191 are divided into 16 memory cell mats, and each of the 16 memory cell mats includes 512 word lines WL0 . . . WL511.

During the read and write operations of the semiconductor memory device, the plurality of the memory banks perform an operation independent from each other, and the memory cell mats operate similarly. For example, although one memory bank is activated and read and write operations are performed, not all the memory cell mats operate. Rather, the read and write operations are performed only in a selected memory cell mat. The other memory cell mats perform an equalization operation based on a precharge operation.

Figure 5:
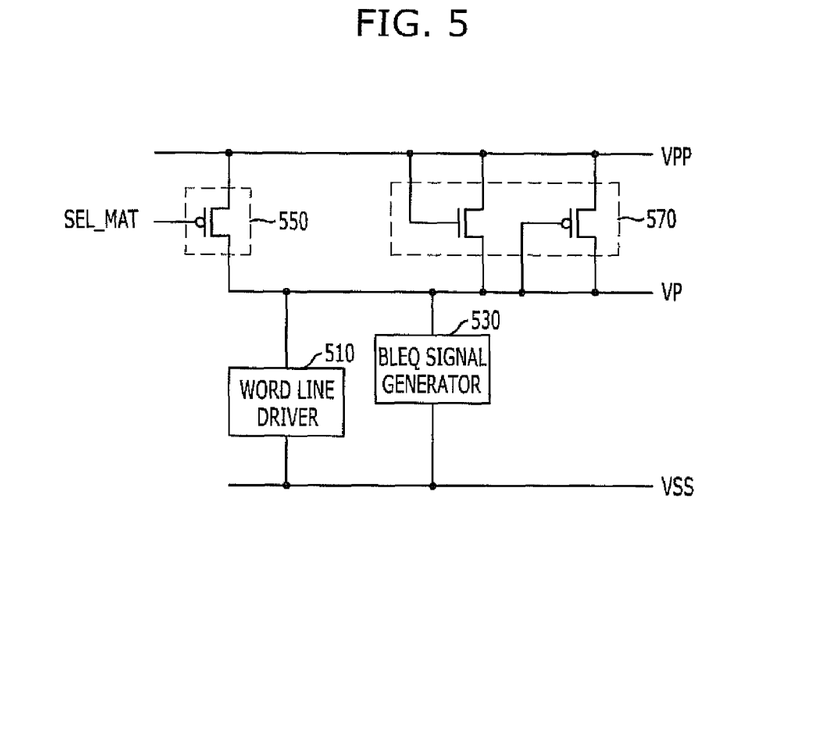
FIG. 5 is a block diagram illustrating a circuit related to a memory cell mat of FIG. 4 in accordance with a first embodiment of the present invention.

FIG. 5 is a block diagram illustrating a circuit related to a memory cell mat of FIG. 4 in accordance with a first embodiment of the present invention. Referring to FIG. 5, the circuit includes a word line driver 510, a bit line equalization (BLEQ) signal generator 530, a power supplier 550, and a voltage sustainer 570.

The word line driver 510 includes a driving circuit for activating a corresponding word line among a plurality of word lines with respect to a memory cell mat selected based upon an active command. The BLEQ signal generator 530 includes a driving circuit for equalizing a corresponding bit line pair BL and /BL with respect to the memory cell mats which are not selected. According to the first embodiment of the present invention, the word line driver 510 and the BLEQ signal generator 530 are coupled with a sub-power source voltage VP terminal.

The power supplier 550 supplies a power source at a pumping power source voltage VPP terminal, which is a main power source voltage terminal, to the sub-power source voltage VP terminal in response to a mat selection signal SEL_MAT for selecting the corresponding memory cell mat.

Herein, the power supplier 550 may be a PMOS transistor having a source-drain path between the pumping power source voltage VPP terminal and the sub-power source voltage VP terminal, and receiving a mat selection signal SEL_MAT through a gate. The power supplier 550 may perform a switching operation in response to the mat selection signal SEL_MAT. In this case, a memory cell mat corresponding to a mat selection signal SEL_MAT of logic low level is selected, and a memory cell mat corresponding to a mat selection signal SEL_MAT of logic high level is not selected. A memory cell mat being selected signifies that the read and write operations are performed in the corresponding memory cell mat. A memory cell mat that is not selected signifies that the precharge operation is performed in the corresponding memory cell mat.

The voltage sustainer 570 prevents the sub-power source voltage VP terminal from decreasing to a voltage level lower than a predetermined voltage level. The voltage sustainer 570 includes a clamping circuit connected between the pumping power source voltage VPP terminal and the sub-power source voltage VP terminal. That is, the voltage sustainer 570 includes a diode-coupled NMOS transistor and a diode-coupled PMOS transistor.

For the sake of convenience in description, an operation of the word line driver 510 will be described with reference to FIG. 6.

Figure 6:
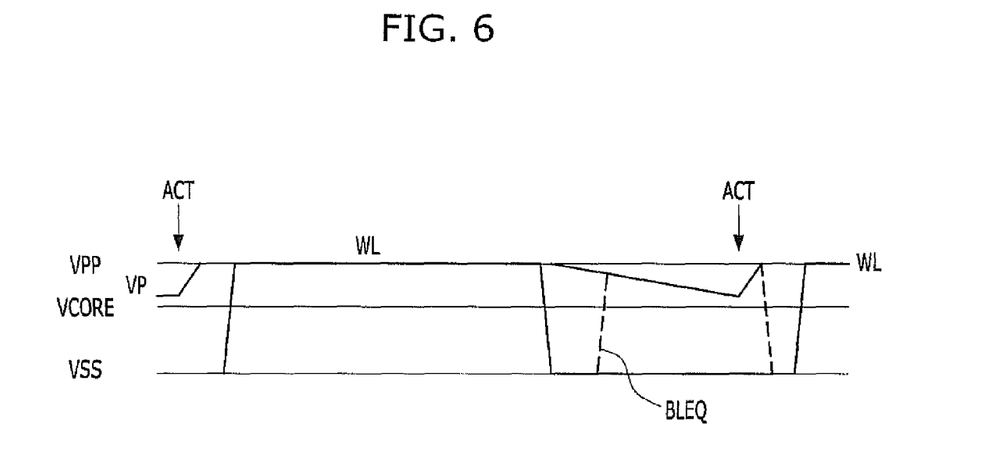
FIG. 6 is a timing diagram illustrating an operation of FIG. 5.

FIG. 6 is a timing diagram illustrating an operation of FIG. 5. Referring to FIGS. 5 and 6, first, when a mat selection signal SEL_MAT corresponding to a selected memory cell mat is activated in response to an active command ACT, a transistor of the power supplier 550 is turned on and a pumping power source voltage VPP is applied to a sub-power source voltage VP terminal. The word line driver 510 activates a word line WL based on the sub-power source voltage VP charged with the pumping power source voltage VPP. While the word line WL is activated, the read and write operations of the semiconductor memory device are performed.

Meanwhile, an equalization operation based on a precharge operation of a bit line pair is performed in a memory cell mat before the next active command is applied. Before the equalization operation based on a precharge operation is described, the circuit of the BLEQ signal generator 530 shown in FIG. 5 will be described in detail with reference to FIG. 7.

Figure 7:
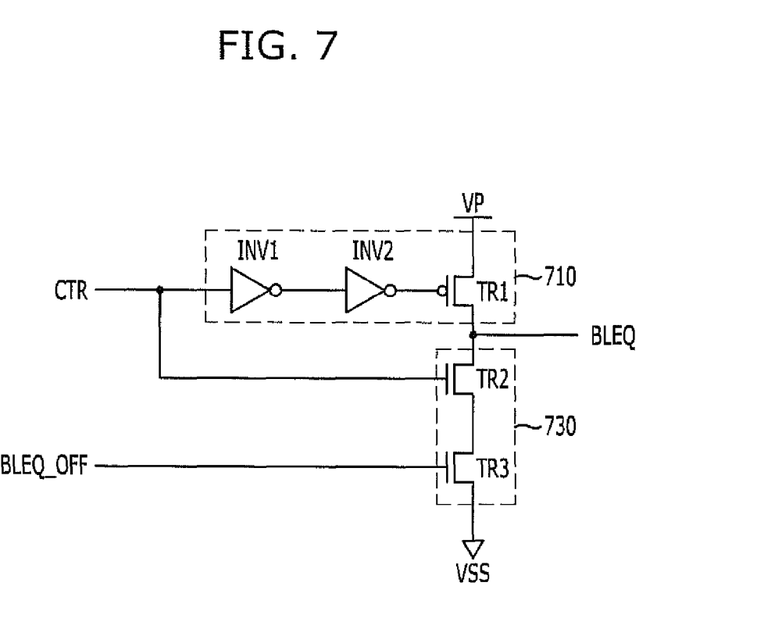
FIG. 7 is a circuit diagram describing a BLEQ signal generator 530 shown in FIG. 5.

FIG. 7 is a circuit diagram describing a BLEQ signal generator 530 shown in FIG. 5. Referring to FIG. 7, the BLEQ signal generator 530 includes a BLEQ signal driver 710 and a BLEQ signal reseter 730.

The BLEQ signal driver 710 drives an output terminal from which a BLEQ signal is outputted based on a sub-power source voltage VP in response to a BLEQ control signal CTR. The BLEQ signal driver 710 includes a first inverter INV1, a second inverter INV2, and a first transistor TR1. Herein, the first transistor TR1 includes a source-drain path between the sub-power source voltage VP terminal and the BLEQ signal reseter 730, and receives an output signal of the second inverter INV2 through a gate. The second inverter INV2 may be realized as a level shifter to effectively control the gate of the first transistor TR1.

The BLEQ signal reseter 730 resets a BLEQ signal in response to a BLEQ off signal BLEQ_OFF. The BLEQ signal reseter 730 includes a second transistor TR2 and a third transistor TR3 which have a source-drain path between a BLEQ signal output terminal and a ground power source voltage VSS terminal. A BLEQ control signal CTR is provided to the gate of the second transistor TR2, and a BLEQ off signal BLEQ_OFF is provided to the gate of the third transistor TR3. The BLEQ signal is reset to logic low level in response to the BLEQ control signal CTR while the BLEQ off signal BLEQ_OFF is activated.

Referring back to FIGS. 5 through 7, an equalization operation based on the precharge operation of a bit line pair will be described hereafter.

First, when a word line WL is inactivated and then a mat selection signal SEL_MAT corresponding to a memory cell mat is inactivated, a transistor of the power supplier 550 is turned off, and the pumping power source voltage VPP is not supplied to the sub-power source voltage VP terminal any more. In short, the sub-power source voltage VP terminal floats along with the pumping power source voltage VPP terminal. Herein, when the BLEQ control signal CTR is activated to logic low level, a BLEQ signal is driven by the BLEQ signal driver 710 with the sub-power source voltage VP.

Meanwhile, the voltage level of the sub-power source voltage VP decreases gradually due to leakage current consumed in the word line driver 510 and the BLEQ signal generator 530. In other words, the semiconductor memory device according to the first embodiment of the present invention uses the leakage current to reduce the voltage level of the sub-power source voltage VP charged with pumping power source voltage VPP. As shown in FIG. 6, the voltage level of the BLEQ signal decreases gradually due to the leakage current. The gradually decreasing voltage level of the BLEQ signal reduces the stress reflected into the respective transistors of the bit line equalizer 170, and also reduces the amount of leakage current caused in the bit line equalizer 170.

The gradient of the decreasing voltage level of the BLEQ signal may be different based on the loading reflected into the BLEQ signal, and the leakage current of both the word line driver 510 and the BLEQ signal generator 530. For example, when there is a large amount of leakage current, the gradient is steep. Conversely, when there is a small amount of leakage current, the gradient is gradual. Herein, the voltage level of the BLEQ signal does not fall lower than a voltage level predetermined by the voltage sustainer 570. The voltage level may be different according to how the voltage sustainer 570 is designed. FIG. 6 shows an example where the voltage level is higher than a core power source voltage VCORE.

Subsequently, when a mat selection signal SEL_MAT is activated in response to the next active command, a transistor of the power supplier 550 is turned on and the sub-power source voltage VP terminal is charged with the pumping power source voltage VPP, and the voltage level of the BLEQ signal is increased to a level corresponding to the pumping power source voltage VPP. Thus, the bit line equalizer 170 receiving the BLEQ signal rapidly precharges the bit line pair BL and /BL and performs an equalization operation.

The semiconductor memory device according to the first embodiment of the present invention may control the voltage level of a BLEQ signal based on leakage current. Generally, the amount of leakage current is in proportion to the driving power of a driving circuit. In other words, a driving circuit with a high driving power produces more leakage current than a driving circuit with a low driving power. The word line driver 510 and the BLEQ signal generator 530 include driving circuits of different driving power. When all the driving circuits inside the word line driver 510 and the BLEQ signal generator 530 are coupled with the sub-power source voltage VP terminal, the voltage level of the sub-power source voltage VP terminal may be changed unstably. Hereafter, a second embodiment for resolving this problem will be described with reference to FIG. 8.

Figure 8:
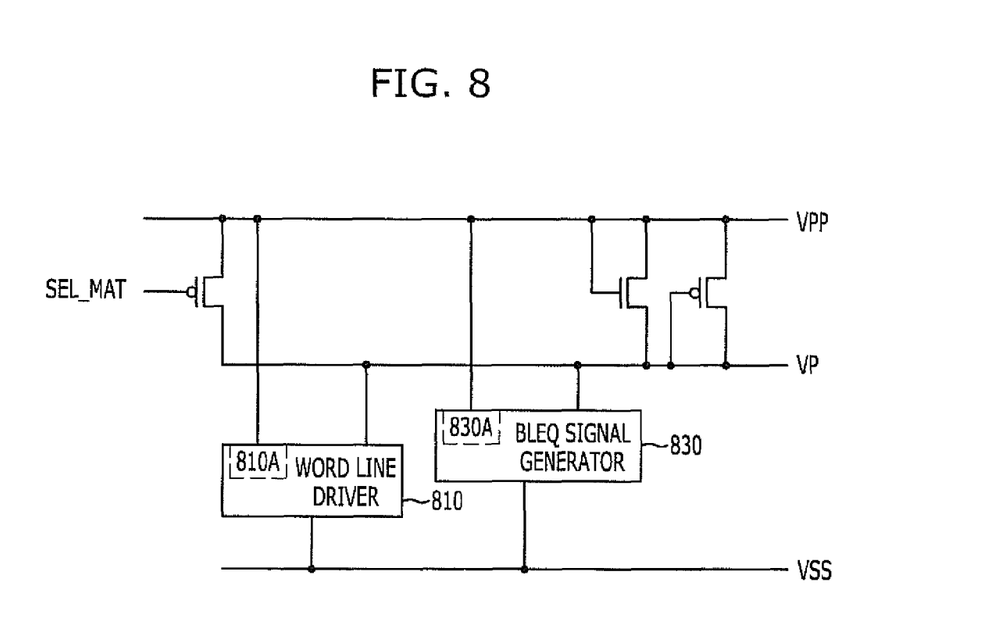
FIG. 8 is a block diagram describing a circuit related to a memory cell mat of FIG. 4 in accordance with a second embodiment of the present invention.

FIG. 8 is a block diagram describing a circuit related to a memory cell mat of FIG. 4 in accordance with a second embodiment of the present invention. Referring to FIG. 8, the circuit includes a word line driver 810 and a BLEQ signal generator 830. The word line driver 810 includes a driving circuit 810A having a low driving power, and the BLEQ signal generator 830 includes a driving circuit 830A having a low driving power as well. Herein, the driving circuit 810A is having a low driving power in the word line driver 810 is coupled with the pumping power source voltage VPP terminal, and the driving circuit 830A having a low driving power in the BLEQ signal generator 830 is coupled with the pumping power source voltage VPP terminal, too. Since the driving circuits 810A and 830A having a low driving power, have a smaller amount of leakage current than the driving circuits having a high driving power, the amount of leakage current is not much although the pumping power source voltage VPP is applied thereto. The driving circuit 830A, having a low driving power, of the BLEQ signal generator 830 may include the first inverter INV1 and the second inverter INV2. In short, the pumping power source voltage VPP may be used as a power source of the first inverter INV1 and the second inverter INV2.

Therefore, since the load reflected on the sub-power source voltage VP terminal may be decreased by implementing driving circuits coupled with the pumping power source voltage VPP terminal according to the second embodiment of the present invention, the voltage level of the sub-power source voltage VP terminal may be stably controlled.

As described above, the semiconductor memory devices according to the first and second embodiments of the present invention use one floating sub-power source voltage VP terminal for the generation of a BLEQ signal, and control the BLEQ signal based on the leakage current caused at the sub-power source voltage VP terminal during a floating state. Therefore, the semiconductor memory devices do not require a power source circuit for generating different power sources, which is required in the conventional technology, and thus an additional control circuit and driving circuit for the power source circuit are not needed. Consequently, the technology of the first and second embodiments of the present invention can reduce the number of required circuits, compared with conventional technology. This means that the chip size of a semiconductor memory device may be decreased, and accordingly, power consumption is reduced as well.

Also, the semiconductor memory devices according to the first and second embodiments can shorten the precharge operation time using a high voltage, and reduce the stress applied to a transistor of the bit line equalizer 170 and leakage current using a low voltage. In short, it is possible to secure an efficient equalization operation for a bit line pair.

The semiconductor memory device according to exemplary embodiments of the present invention can reduce the chip size of a semiconductor memory device by using one power source voltage terminal floated for the generation of a BLEQ signal.

Also, the semiconductor memory device according to one embodiment of the present invention can perform an effective equalization operation of a bit line pair by controlling a voltage level of a BLEQ signal based on leakage current.

While the present invention has been described with respect to the specific embodiments, it will be apparent to those skilled in the art that various changes and modifications may be made without departing from the spirit and scope of the invention as defined in the following claims.

Moreover, the positions and kinds of logic gates and transistors illustrated in the above-described embodiments may be different according to the polarity of an inputted signal.

What is claimed is:

1. A semiconductor memory device, comprising:
a power source supplier configured to supply a power source of a main power source voltage terminal to a sub-power source voltage terminal in response to a mat selection signal for selecting a corresponding memory cell mat among a plurality of memory cell mats;
a bit line equalization (BLEQ) signal generator configured to be coupled with the sub-power source voltage terminal and generate a BLEQ signal corresponding to a voltage level of the sub-power source voltage terminal in response to a BLEQ control signal;
a bit line equalizer configured to precharge and equalize a bit line pair in response to the BLEQ signal; and
a word line driver configured to be coupled with the sub-power source voltage terminal and drive a word line,
wherein the BLEQ signal generator comprises:
a BLEQ signal driver configured to receive a power from the sub-power source voltage terminal only in driving the BLEQ signal to the voltage level of the sub-power source voltage terminal in response to the BLEQ control signal; and
a BLEQ signal reseter configured to reset the BLEQ signal to a first voltage level in response to a BLEQ off signal,
wherein the BLEO signal is generated by using a leakage current caused by floating the sub-power source voltage terminal after the word line driver is inactivated.

2. The semiconductor memory device of claim 1, wherein the sub-power source voltage terminal is arranged to float with respect to the main power source voltage terminal in response to the mat selection signal.

3. The semiconductor memory device of claim 1, further comprising:
a voltage sustainer configured to prevent a voltage level of the sub-power source voltage terminal from being decreased to a voltage level lower than a predetermined voltage level.

4. The semiconductor memory device of claim 3, wherein the voltage sustainer comprises a clamping circuit coupled between the main power source voltage terminal and the sub-power source voltage terminal.

5. The semiconductor memory device of claim 1, wherein the power source supplier is coupled between the main power source voltage terminal and the sub-power source voltage terminal and configured to perform a switching operation in response to the mat selection signal.

6. A semiconductor memory device, comprising:
a power source supplier configured to supply a power source of a main power source voltage terminal to a sub-power source voltage terminal in response to a mat selection signal for selecting a corresponding memory cell mat among a plurality of memory cell mats;
a bit line equalization (BLEQ) signal generator configured to have a power source terminal coupled with the main power source voltage terminal and the sub-power source voltage terminal, and generate a BLEQ signal corresponding to a voltage level of the sub-power source voltage terminal in response to a BLEQ control signal;
a bit line equalizer configured to precharge and equalize a bit line pair in response to the BLEQ signal; and
a word line driver configured to have a first power source terminal coupled with the main power source voltage terminal and the sub-power source voltage terminal, and drive a word line,
wherein the BLEQ signal is generated by using a leakage current caused by floating the sub-power source voltage terminal after the word line driver is inactivated.

7. The semiconductor memory device of claim 6, wherein the sub-power source voltage terminal is arranged to float with respect to the main power source voltage terminal in response to the mat selection signal.

8. The semiconductor memory device of claim 6, wherein the BLEQ signal generator comprises:
a first driver coupled with the main power source voltage terminal; and
a second driver coupled with the sub-power source voltage terminal and configured to generate the BLEQ signal through a driving operation.

9. The semiconductor memory device of claim 6, wherein the word line driver comprises:
a first driver coupled with the main power source voltage terminal; and
a second driver coupled with the sub-power source voltage terminal.

10. The semiconductor memory device of claim 6, further comprising:
a voltage sustainer configured to prevent a voltage level of the sub-power source voltage terminal from being decreased to a voltage level lower than a predetermined voltage level.

11. The semiconductor memory device of claim 10, wherein the voltage sustainer comprises a clamping circuit coupled between the main power source voltage terminal and the sub-power source voltage terminal.

12. The semiconductor memory device of claim 6, wherein the power source supplier is coupled between the main power source voltage terminal and the sub-power source voltage terminal and configured to perform a switching operation in response to the mat selection signal.

13. The semiconductor memory device of claim 6, wherein the BLEQ signal generator comprises:
a BLEQ signal driver configured to drive the BLEQ signal to the voltage level of the sub-power source voltage terminal in response to the BLEQ control signal; and
a BLEQ signal reseter configured to reset the BLEQ signal to a predetermined voltage level in response to a BLEQ off signal.

14. A method for driving a semiconductor memory device, comprising:
selecting a memory cell mat and performing a predetermined operation;
floating a sub-power source voltage terminal to thereby decrease a voltage level of the sub-power source voltage terminal when the memory cell mat is inactivated after the performing of the predetermined operation;
increasing the voltage level of the sub-power source voltage terminal, when the memory cell mat is selected;
receiving a power from the sub-power source voltage terminal only in driving a bit line equalization (BLEQ) in response to a BLEQ control signal; and
resetting the BLEQ signal to a first voltage level in response to a BLEQ off signal,
wherein the BLEQ signal is generated b using a leakage current caused by floating the sub-power source voltage terminal after the memory cell mat is inactivated.

15. The method of claim 14, further comprising:
    precharging and equalizing a bit line pair in response to the BLEQ signal corresponding to the increased voltage level of the sub-power source voltage terminal.

16. The method of claim 14, wherein the voltage level of the sub-power source voltage terminal is decreased due to leakage current of a circuit.

17. The method of claim 14, further comprising:
    preventing a voltage level of the sub-power source voltage terminal from being decreased to a voltage level lower than a predetermined voltage level.

* * * * *

UNITED STATES PATENT AND TRADEMARK OFFICE
CERTIFICATE OF CORRECTION

PATENT NO.       : 8,363,489 B2  
APPLICATION NO.  : 12/649379  
DATED            : January 29, 2013  
INVENTOR(S)      : Tae-Hyung Jung Page 1 of 1

It is certified that error appears in the above-identified patent and that said Letters Patent is hereby corrected as shown below:

On the Title page, Item (54) and column 1, lines 1-3 change the Title section as follows:

A SEMICONDUCTOR DEVICE HAVING BIT LINE EQUALIZATION USING LOW VOLTAGE AND A METHOD THEREOF

Signed and Sealed this  
Twelfth Day of March, 2013

Teresa Stanek Rea  
*Acting Director of the United States Patent and Trademark Office*